(12) United States Patent
Sugino et al.

(10) Patent No.: US 10,852,193 B2
(45) Date of Patent: Dec. 1, 2020

(54) THERMAL INFRARED DETECTOR AND MANUFACTURING METHOD THEREOF

(71) Applicant: Mitsubishi Electric Corporation, Tokyo (JP)

(72) Inventors: Takaki Sugino, Tokyo (JP); Shinichi Hosomi, Tokyo (JP); Takafumi Hara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 348 days.

(21) Appl. No.: 15/939,830

(22) Filed: Mar. 29, 2018

(65) Prior Publication Data

US 2019/0145829 A1 May 16, 2019

(30) Foreign Application Priority Data

Nov. 16, 2017 (JP) ................. 2017-220609

(51) Int. Cl.
*G01J 5/20* (2006.01)
*G01J 5/08* (2006.01)
*G01J 5/04* (2006.01)
*H01L 31/18* (2006.01)
*G01J 5/02* (2006.01)

(52) U.S. Cl.
CPC ............. *G01J 5/0803* (2013.01); *G01J 5/023* (2013.01); *G01J 5/024* (2013.01); *G01J 5/046* (2013.01); *G01J 5/048* (2013.01); *G01J 5/20* (2013.01); *H01L 31/1892* (2013.01); *G01J 2005/202* (2013.01)

(58) Field of Classification Search
CPC ...... G01J 5/02; G01J 5/023; G01J 5/08; G01J 5/10; G01J 5/024
See application file for complete search history.

(56) References Cited

U.S. PATENT DOCUMENTS

| 5,286,976 | A | 2/1994 | Cole | |
| 6,144,030 | A | 11/2000 | Ray et al. | |
| 7,005,644 | B2* | 2/2006 | Ishikawa | G01J 5/02 250/338.4 |
| 7,145,144 | B2* | 12/2006 | Nakaki | G01J 5/02 250/339.04 |
| 2004/0200962 | A1 | 10/2004 | Ishikawa et al. | |
| 2015/0257256 | A1* | 9/2015 | Sato | H05K 1/0269 257/774 |

FOREIGN PATENT DOCUMENTS

JP 3944465 B2 7/2007

\* cited by examiner

*Primary Examiner* — David P Porta
*Assistant Examiner* — Fani Boosalis
(74) *Attorney, Agent, or Firm* — Sughrue Mion, PLLC; Richard C. Turner (57) ABSTRACT

An infrared sensor includes a supporting body having supporting body metal wiring that allows infrared rays to pass through. The supporting body is provided so as to cover one portion of an infrared detecting portion in a different plane spatially separated from that of the infrared detecting portion. The supporting body metal wiring disposed in an interior of the supporting body is such that one portion of a cobalt iron film is oxidized by a plasma discharge being carried out in an oxygen atmosphere. According to this kind of structure, infrared rays pass through the supporting body, and are absorbed by the infrared detecting portion, because of which there is no need to provide an infrared absorption layer in an upper layer of the supporting body.

17 Claims, 6 Drawing Sheets

THERMAL INFRARED DETECTOR AND MANUFACTURING METHOD THEREOF

BACKGROUND OF THE INVENTION

Field of the Invention

The present invention relates to a thermal infrared detector that detects infrared rays by converting the infrared rays to heat, and to a manufacturing method thereof.

Description of the Background Art

Infrared detectors used in an infrared solid-state imaging device or the like are broadly categorized into a quantum type, which captures extreme infrared rays radiated from an object as photons, and a thermal type, which captures the extreme infrared rays as thermal energy generated by molecular resonant movement. The quantum type is characterized by having low noise, high sensitivity, and high speed response, but as light has little energy, an imaging element needs to be cooled to in the region of minus 200° C. Because of this, a chiller for cooling the imaging element is needed inside the device, and the device becomes complex and expensive.

Meanwhile, the thermal type is capable of room temperature operation, and an infrared detecting portion, which has a temperature sensor, and a signal readout circuit can be formed simultaneously in a semiconductor line, because of which the thermal type is advantageous in terms of reducing size and reducing cost compared with the quantum type. Because of this, the thermal type is mainstream in civil fields such as security and mounting in a vehicle, and is required to be small, low cost, and highly sensitive.

An existing thermal infrared detector is such that an infrared detecting portion is supported by a supporting leg, which is a heat insulating structure, and a substrate and the infrared detecting portion are thermally separated. Existing technology is such that the supporting leg is formed to be as long as possible, whereby heat insulating characteristics are improved, and an increase in sensitivity is achieved. A bridge structure wherein a bolometer film forming a temperature sensor is raised above the substrate by a thin film supporting leg having high thermal resistance is disclosed in, for example, Patent Document 1. The bolometer film is thermally separated from the substrate by the supporting leg, and is electrically joined to a signal readout circuit formed in the substrate below the bridge by thin metal wiring formed inside the supporting leg.

Also, in order to increase sensitivity with respect to infrared rays, an aperture ratio, which is a ratio of a pixel area occupied by an infrared absorption region, is desirably as large as possible. However, in order to achieve a reduction in size of the thermal infrared detector, a pixel pitch of an infrared sensor array needs to be reduced, whereby the pixel area becomes smaller. Because of this, the kind of structure described in Patent Document 1 wherein the temperature sensor and the supporting leg are formed in the same plane has a problem in that when attempting to increase the aperture ratio, the supporting leg cannot be lengthened, and when lengthening the supporting leg, the aperture ratio cannot be increased.

In order to resolve this kind of problem, an idea such that area efficiency is increased by a temperature sensor and a supporting leg being formed in separate layers distanced from each other is adopted in Patent Document 2 and Patent Document 3. A two-story structure wherein a bolometer film and an infrared absorption layer are formed integrally over a wide region, and a thin film supporting leg having high thermal resistance is formed in a separate layer below the wide region, is disclosed in Patent Document 2.

Also, a three-story structure wherein an infrared absorption layer, a heat insulating supporting leg, and a temperature sensor are formed sequentially, as seen from an infrared ray incident direction, in differing planes spatially separated from each other is disclosed in Patent Document 3. By adopting this kind of two-story or three-story structure, the supporting leg can easily be lengthened, and the pixel aperture ratio can be increased.

[Patent Document 1] U.S. Pat. No. 5,286,976
[Patent Document 2] U.S. Pat. No. 6,144,030
[Patent Document 3] Japanese Patent No. 3,944,465

However, the two-story structure disclosed in Patent Document 2 is such that the temperature sensor is provided above the supporting leg, because of which the process of forming the temperature sensor is the final process, and a temperature sensor that needs high temperature processing cannot be used. That is, wiring of a metal such as aluminum is formed from the supporting leg in the lower layer to the substrate, because of which a heat treatment temperature during the process of forming the temperature sensor in the upper layer cannot exceed a temperature tolerated by the metal wiring (approximately 500° C. in the case of aluminum).

Because of this, Patent Document 2 is such that not only a temperature sensor that needs high temperature processing in the formation process cannot be used, but advantages of high temperature heat treatment, that is, advantages of increasing electrical characteristic stability by recovering plasma damage in a manufacturing device, and restricting noise occurring in an electrical contact portion, cannot be enjoyed.

Meanwhile, the three-story structure disclosed in Patent Document 3 is such that the supporting leg can easily be lengthened and, as the temperature sensor is in a lower layer, a temperature sensor that needs high temperature processing can be used. Because of this, advantages of increasing electrical characteristic stability and restricting noise owing to high temperature heat treatment can be enjoyed. Furthermore, infrared rays can be efficiently absorbed by the infrared absorption layer provided in an uppermost layer, and an infrared sensor S/N ratio can easily be increased, which is advantageous with respect to improving performance. However, being a three-story structure means that a pixel structure is complex, and a manufacturing process is also complex, because of which achieving a cost reduction is difficult.

SUMMARY OF THE INVENTION

The invention, having been contrived in order to resolve the heretofore described kinds of problem, has an object of providing a small, highly sensitive, and low cost thermal infrared detector, and a manufacturing method thereof.

A thermal infrared detector according to the invention includes, on a substrate, an infrared detecting portion having a temperature sensor that converts a temperature change caused by an incidence of infrared rays into an electrical signal, and a supporting body having a supporting body metal wiring that reads an electrical signal from the temperature sensor, wherein the infrared detecting portion is held by the supporting body via a hollow portion between the infrared detecting portion and the substrate, the supporting body is provided so as to cover one portion of the infrared detecting portion as seen from an infrared ray incident direction in a differing plane spatially separated from the infrared detecting portion, and a metal material that allows infrared rays to pass through is used for the supporting body metal wiring.

A thermal infrared detector manufacturing method according to the invention is a method of manufacturing a thermal infrared detector such that an infrared detecting portion is held by a supporting body via a hollow portion between the infrared detecting portion and the substrate, the manufacturing method including a step of forming the infrared detecting portion having a temperature sensor that converts a temperature change caused by an incidence of infrared rays into an electrical signal on the substrate, a step of forming a sacrificial layer that covers the infrared detecting portion and of which one portion is in contact with the substrate, a step of partially removing the sacrificial layer, thereby exposing one portion of the temperature sensor, a step of forming a supporting body metal wiring layer on the sacrificial layer so as to be electrically connected to the temperature sensor exposed in the sacrificial layer, a step of modifying the supporting body metal wiring layer so that infrared rays pass through, and a step of removing the sacrificial layer and one portion of the substrate, thereby forming the supporting body and the hollow portion.

According to the thermal infrared detector according to the invention, a supporting body is provided in a plane differing from that of an infrared detecting portion, because of which the supporting body can be lengthened easily in comparison with a case in which a supporting body is provided in the same plane as that of an infrared detecting portion, and heat insulating characteristics improve. Also, a pixel aperture ratio of the infrared detecting portion can be increased, whereby sensitivity to infrared rays can be increased. Furthermore, supporting body metal wiring is configured of a metal film that allows infrared rays to pass through, because of which the supporting body can be disposed so as to cover the infrared detecting portion, and there is no need to provide an infrared absorption layer in an upper layer of the supporting body, because of which a structure is simple.

According to the thermal infrared detector manufacturing method according to the invention, an infrared detecting portion is formed before a supporting body metal wiring layer, because of which there is no need to take temperature tolerated by the supporting body metal wiring layer into consideration, and a temperature sensor that needs high temperature processing in a formation process can be used. Also, as a supporting body allows infrared rays to pass through, there is no need to provide an infrared absorption layer in an upper layer of the supporting body, and manufacture is easy. Therefore, according to the invention, a small, highly sensitive, and low cost thermal infrared detector is obtained.

The foregoing and other objects, features, aspects and advantages of the invention will become more apparent from the following detailed description of the present invention when taken in conjunction with the accompanying drawings.

DETAILED DESCRIPTION OF THE PREFERRED EMBODIMENTS

First Embodiment

Figure 1:
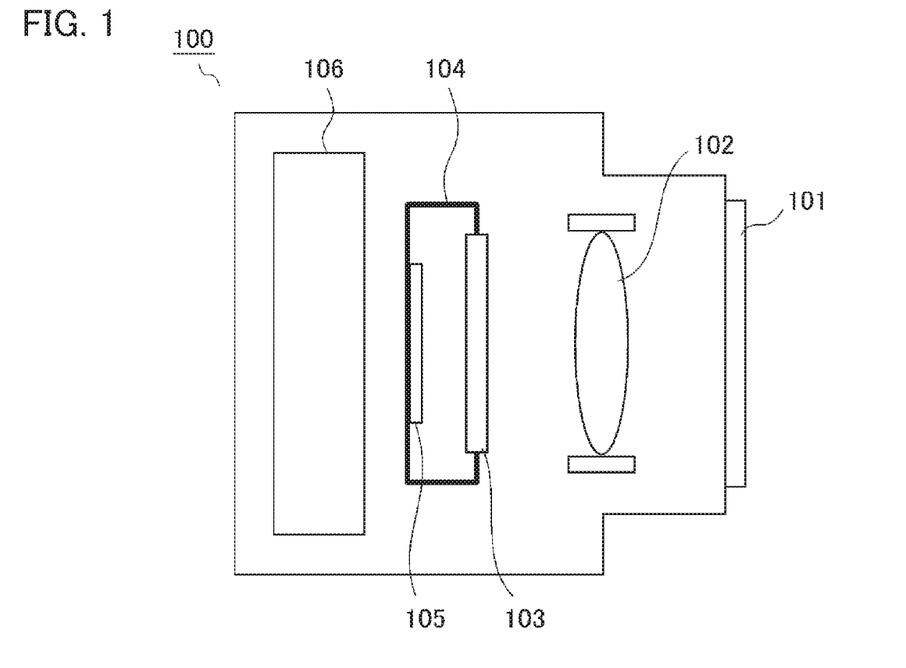
FIG. 1 is a schematic view of a thermal infrared solid-state imaging device according to a first embodiment of the invention.
Figure 2:
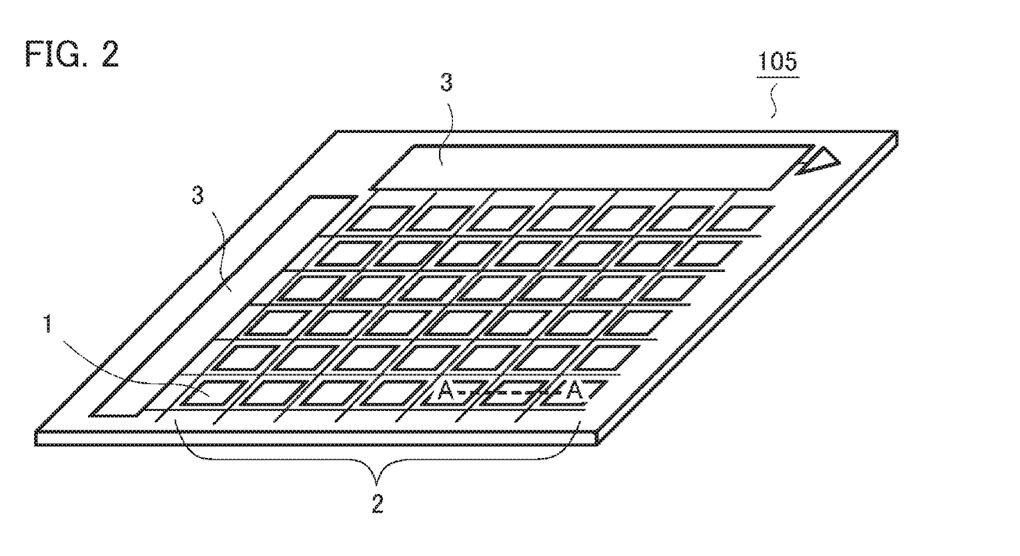
FIG. 2 is a perspective view showing an infrared image sensor according to the first embodiment of the invention.
Figure 3:
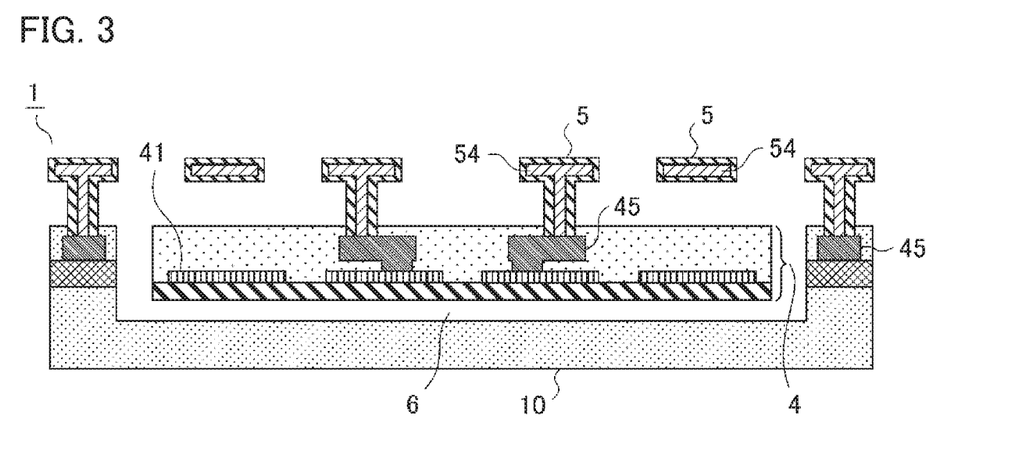
FIG. 3 is a sectional view schematically showing an infrared sensor according to the first embodiment of the invention.
Figure 4:
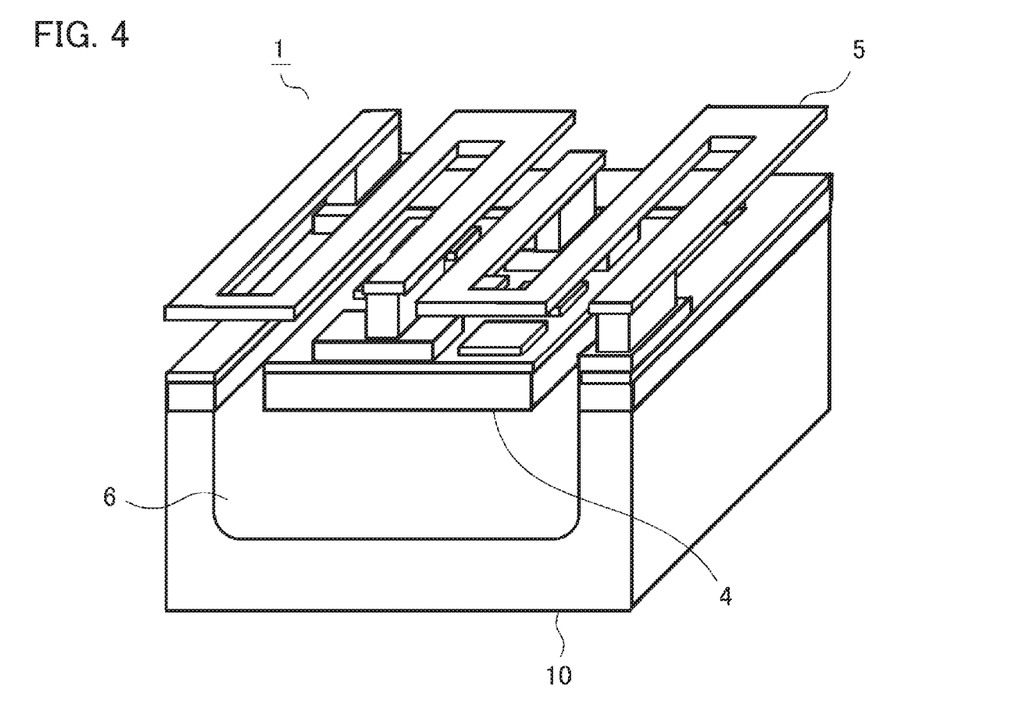
FIG. 4 is a perspective view schematically showing the infrared sensor according to the first embodiment of the invention.

Hereafter, based on the drawings, a description will be given of a thermal infrared detector, and a manufacturing method thereof, according to a first embodiment of the invention. FIG. 1 is a schematic view of a thermal infrared solid-state imaging device including the thermal infrared detector according to the first embodiment, FIG. 2 is a perspective view showing an infrared image sensor according to the first embodiment, and FIGS. 3 and 4 are a sectional view and a perspective view schematically showing an infrared sensor (a portion indicated by A-A in FIG. 2) according to the first embodiment. The same reference signs are allotted to identical or corresponding portions in the drawings.

A thermal infrared solid-state imaging device 100 includes a lens protecting window 101 attached to a frame, an optical lens 102 on which infrared rays fall incident, an infrared image sensor 105 housed in a package 104 to which a window material 103 is attached, a signal processing circuit 106 that processes an output image signal, and the like.

As shown in FIG. 2, the infrared image sensor 105 includes an infrared sensor array 2 wherein an infrared sensor 1, which is a thermal infrared detector that converts a temperature change caused by an incidence of infrared rays into an electrical signal, is disposed in a two-dimensional matrix, and a signal readout circuit 3 disposed on a periphery of the infrared sensor array 2. The signal readout circuit 3 sequentially reads out the electrical signal of each infrared sensor 1, and outputs an image signal in accordance with the incident infrared rays.

A structure of the infrared sensor 1 according to the first embodiment will be described using FIGS. 3 and 4. Details of a film configuring the infrared sensor 1 are omitted from FIG. 3. An infrared detecting portion 4 of the infrared sensor 1 is adiabatically held by a supporting body 5 between the supporting body 5 and a supporting substrate 10 across a hollow portion 6. Two or more PN junction diodes 41 acting as temperature sensors are connected in series in the infrared detecting portion 4, and each PN junction diode 41 is electrically joined by metal wiring 45 and supporting body metal wiring 54.

A simple description will be given of an infrared detecting principle of the infrared image sensor 105 in the thermal infrared solid-state imaging device 100. Infrared rays emitted by an object fall incident on the infrared sensor 1 of the infrared sensor array 2. The temperature of the infrared sensor 1 on which the infrared rays fall incident rises due to the energy of the infrared rays, and electrical characteristics of the PN junction diode 41 of the infrared detecting portion 4 change in accordance with the temperature change.

A temperature sensor of the infrared detecting portion 4 not being limited to the PN junction diode 41, a temperature sensor configured of a transistor or a resistive bolometer film may also be used. The infrared image sensor 105 reads a change in the electrical characteristics of the temperature sensor using the signal readout circuit 3, and outputs the electrical characteristics to the exterior, whereby a thermal image of the object is obtained.

That is, it is desirable that the temperature of the infrared sensor 1 rises considerably in response to incident energy, and that the electrical characteristics of the PN junction diode 41 change considerably, to which end it is important that the infrared detecting portion 4 efficiently converts the incident infrared rays without loss. The infrared sensor 1 according to the first embodiment includes a structure such that incident infrared rays can be efficiently transmitted to the infrared detecting portion 4.

A description will be given of a method of manufacturing the infrared image sensor 105 according to the first embodiment. Firstly, using FIGS. 5A to 5E, a process of manufacturing a base structural body of the infrared image sensor 105 will be described. In FIGS. 5A to 5E, a cross-section of the infrared sensor 1 configuring one pixel of the infrared sensor array 2 is shown, and the signal readout circuit 3 is omitted.

Figure 5A:
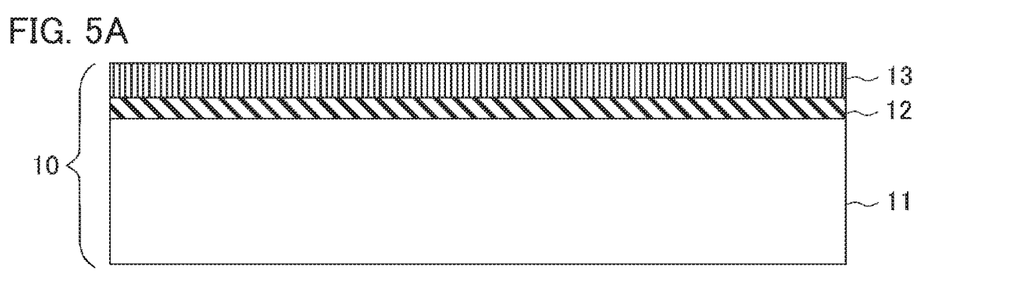
FIGS. 5A to 5E are sectional views illustrating a method of manufacturing a base structural body of the infrared sensor according to the first embodiment of the invention.

As shown in FIG. 5A, a so-called silicon-on-insulator (SOI) substrate, wherein an embedded silicon oxide film layer and a single crystal silicon layer 13 are stacked sequentially on a single crystal silicon supporting substrate 11, is prepared as the supporting substrate 10.

Figure 5B:
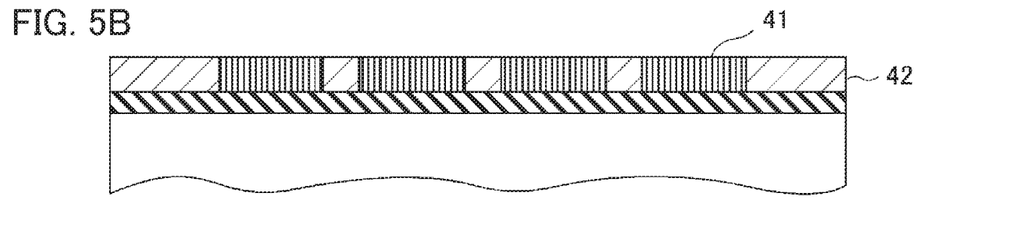

Next, as shown in FIG. 5B, each PN junction diode 41 is electrically isolated by a thermally oxidized film 42 using, for example, a local oxidation method such as a local oxidation of silicon (LOCOS) separation method in order to separate the PN junction diodes 41. Continuing, a region that is to form the unshown signal readout circuit 3 is formed on the single crystal silicon supporting substrate 11.

Furthermore, N-type or P-type impurity atoms are implanted to a predetermined depth in a predetermined position in the PN junction diode 41 using photolithography technology and ion implantation technology or the like, thereby providing a P-type or N-type impurity layer (omitted from the drawings) that functions as a diode. The predetermined position is a position in which forward characteristics of the PN junction physically carry out a desired operation, and a region in which an impurity concentration distribution in the single crystal silicon layer 13 is uniform, or a region in which a concentration gradient is intentionally provided, is formed to a predetermined depth.

Figure 5C:
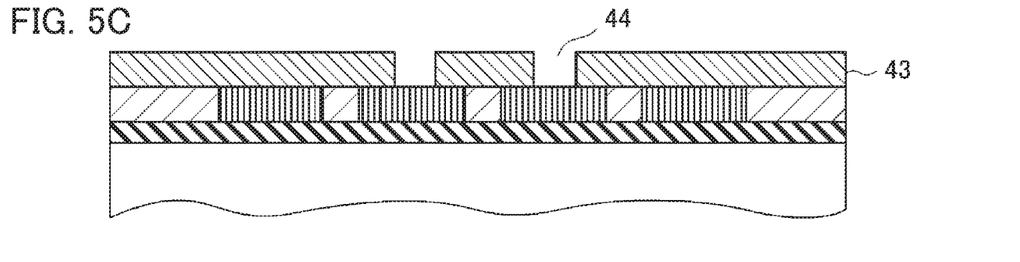

Next, as shown in FIG. 5C, a first interlayer oxide film 43 is deposited over a whole surface, and a first contact hole 44 is opened in a predetermined depth in a predetermined position in the first interlayer oxide film 43 using photolithography technology and dry etching technology. By so doing, one portion of the PN junction diode 41 is exposed.

Figure 5D:
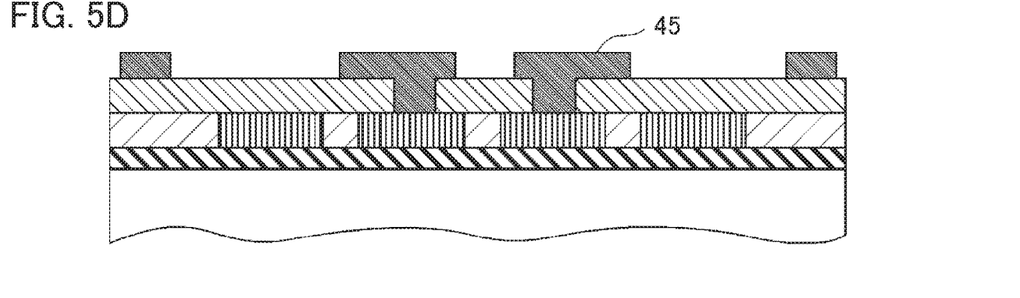

Furthermore, as shown in FIG. 5D, the metal wiring 45, which electrically connects the PN junction diode 41 and the signal readout circuit 3, is formed. A material of the metal wiring 45 is not particularly limited, provided that the material has a desired resistance value. Also, the material may also be used as a metal silicide film using lamp annealing technology or the like.

Figure 5E:
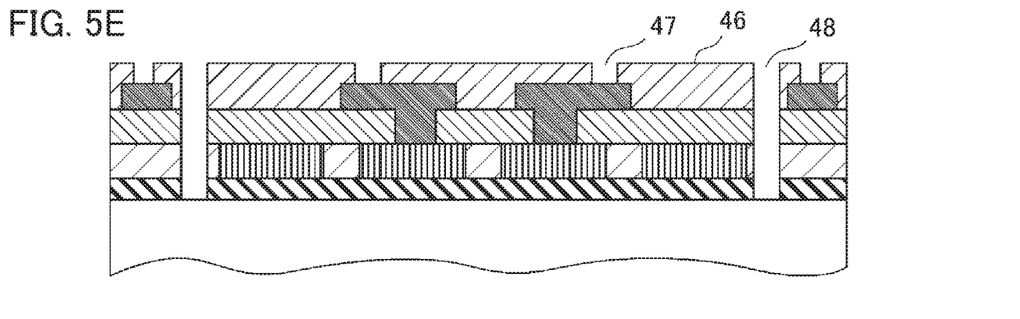

Continuing, as shown in FIG. 5E, a second interlayer oxide film 46 that electrically isolates the metal wiring 45 is deposited, and a second contact hole 47 and an etching hole are opened in predetermined positions in the second interlayer oxide film 46. The PN junction diode 41 and the metal wiring 45 are electrically connected to the supporting body metal wiring 54, to be formed later, by the second contact hole 47. The etching hole 48 reaches the single crystal silicon substrate 11. The base structural body wherein the portion that is to form the infrared detecting portion 4 of the infrared sensor 1 is formed is completed by the heretofore described process.

Figure 6A:
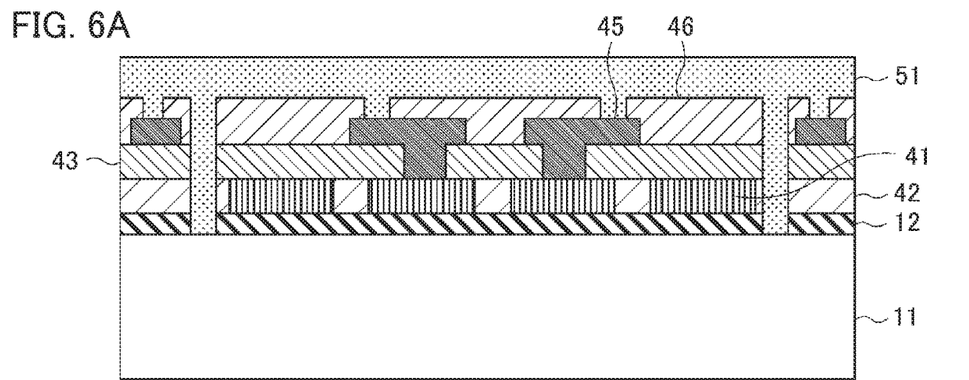
FIGS. 6A to 6D are sectional views illustrating a method of manufacturing the infrared sensor according to the first embodiment of the invention.

Next, using FIGS. 6A to 6D, a description will be given of the manufacturing method after the base structural body formation, that is, a process of forming the supporting body 5 that connects the pixel portion including the PN junction diode 41 and the signal readout circuit (omitted from the drawings). As shown in FIG. 6A, a sacrificial layer 51 that covers the infrared detecting portion, and of which one portion is in contact with a substrate (herein, the single crystal silicon supporting substrate 11), is formed on a surface of the base structural body. A material that can be selectively removed by etching with a component of the infrared sensor 1 in a final process, for example, an organic material, is used as the sacrificial layer 51.

Figure 6B:
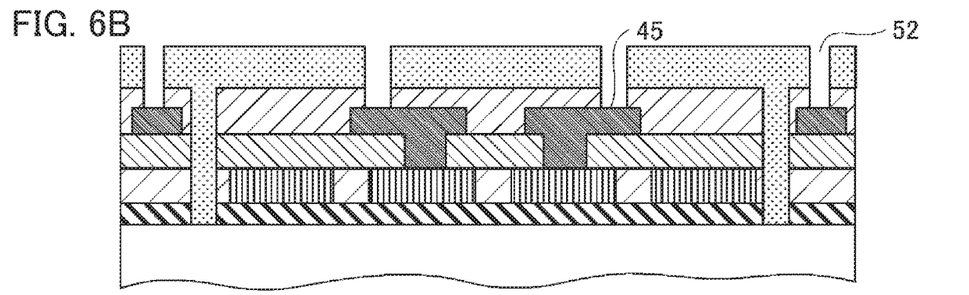

Next, as shown in FIG. 6B, a sacrificial layer aperture portion 52 is formed by partially removing the sacrificial layer 51 in a predetermined position using photolithography technology, thereby exposing the metal wiring 45 connected to one portion of the temperature sensor, in this case the PN junction diode 41. Continuing, a silicon oxide film ($SiO_2$) that is to form a supporting body lower layer film 53 is formed using, for example, plasma-enhanced chemical vapor deposition (PECVD) technology on the sacrificial layer 51 so as to cover the sacrificial layer aperture portion 52. Furthermore, the silicon oxide film that is to form the supporting body lower layer film 53 is removed by etching in only the sacrificial layer aperture portion 52 portion, using photolithography technology and etching technology.

Continuing, a supporting body metal wiring layer that is to form the supporting body metal wiring 54 is formed in an interior of the sacrificial layer aperture portion 52 and above the supporting body lower layer film 53 so as to be electrically connected to the metal wiring 45 exposed in the sacrificial layer 51, using physical vapor deposition (PVD) technology. A film thickness of the supporting body metal wiring layer in a portion that is to form an upper layer of the supporting body lower layer film 53 is, for example, 40 Å.

A metal material that transmits infrared rays owing to an oxidizing or nitriding process, or heat treatment or the like equivalent thereto, is used as the supporting body metal wiring layer. In the first embodiment, cobalt iron (CoFe) is used as the supporting body metal wiring layer, but this not being limiting, a metal material other than a precious metal, for example, a metal material selected from titanium (Ti), aluminum (Al), chromium (Cr), an alloy including any one of these, or the like, can be used.

Continuing, the supporting body metal wiring layer is modified so that infrared rays pass through. In the first embodiment, one portion of the supporting body metal wiring layer is oxidized by carrying out a plasma discharge in an oxygen atmosphere. Processing conditions at this time are, for example, RF power of 1,400 W, a stage temperature of 140 degrees, an oxygen flow of 300 cc, a processing pressure of 130 Pa, and a processing time of 300 seconds.

In the process of modifying the supporting body metal wiring layer so that infrared rays pass through, one portion of the supporting body metal wiring layer may be oxidized by carrying out heat treatment in an oxygen atmosphere. Alternatively, one portion of the supporting body metal wiring layer may be nitrided by carrying out a plasma discharge or heat treatment in a nitrogen atmosphere. In either case, it is desirable that a portion of a predetermined depth in a film thickness direction from a surface of the supporting body metal wiring layer is oxidized or nitrided, leaving a portion that is not oxidized or nitrided.

After the supporting body metal wiring layer is formed, a silicon oxide film that is to form a supporting body upper layer film 55 is deposited using, for example, PECVD technology. The supporting body lower layer film 53 and the supporting body upper layer film 55 are desirably formed as thinly as possible. By so doing, heat insulating characteristics of the supporting body 5 are improved, and performance of the infrared sensor 1 improves. Also, the supporting body upper layer film 55 and the supporting body lower layer film 53, not being limited to silicon oxide films, may be silicon nitride films (SiN), or alternatively, insulating thin films having characteristics equivalent to or superior to a silicon oxide film or a silicon nitride film can be used.

Figure 6C:
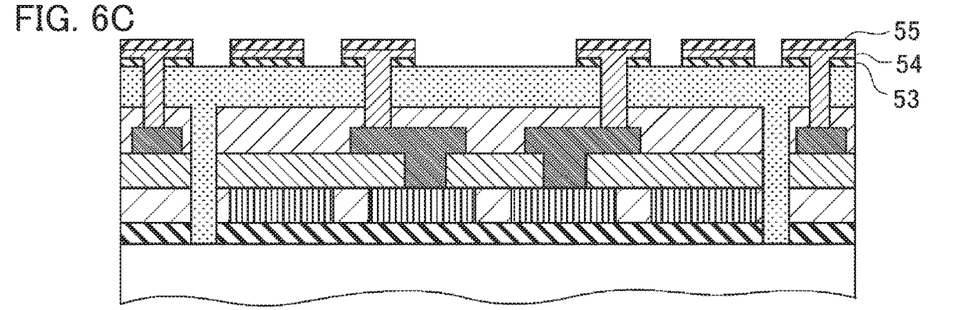

Next, as shown in FIG. 6C, the supporting body upper layer film 55, the supporting body metal wiring 54, and the supporting body lower layer film 53 are formed to a desired form using photolithography technology and etching technology. In the first embodiment, a photoresist is formed so as to have a width of 500 nm using exposure apparatus having an i-line, which is a mercury spectral wavelength of, for example, 365 nm, as a light source, after which unnecessary film is removed by etching using dry etching technology.

Figure 6D:
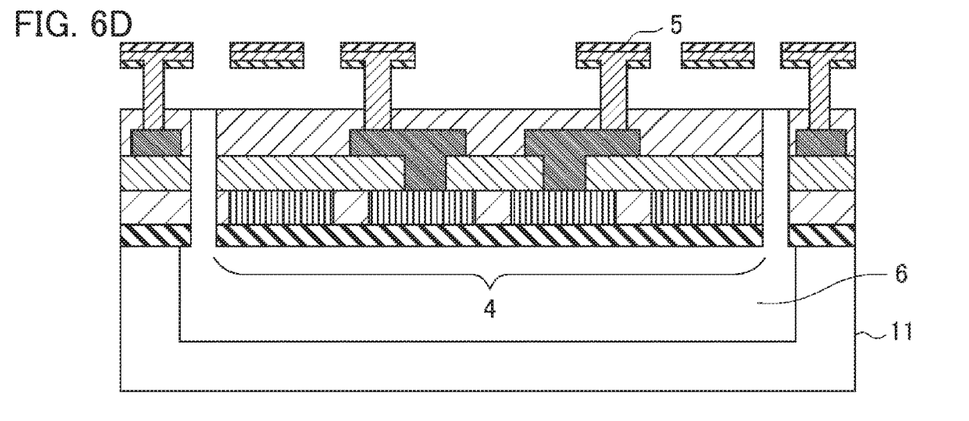

Continuing, as shown in FIG. 6D, one portion of the sacrificial layer 51 and the single crystal silicon supporting substrate 11 are removed using, for example, oxygen plasma processing and etching technology such as tetramethylammonium hydroxide (TMAH), thereby forming the supporting body 5 and the hollow portion 6. Finally, a silicon oxide film is formed using, for example, PECVD technology as a protective film (omitted from the drawings) that covers the whole of the supporting body metal wiring 54 of the supporting body 5. The infrared sensor 1 wherein the infrared detecting portion 4 is held by the supporting body 5 via the hollow portion 6 between the infrared detecting portion 4 and the single crystal silicon supporting substrate 11 is completed by the heretofore described process.

Figure 7:
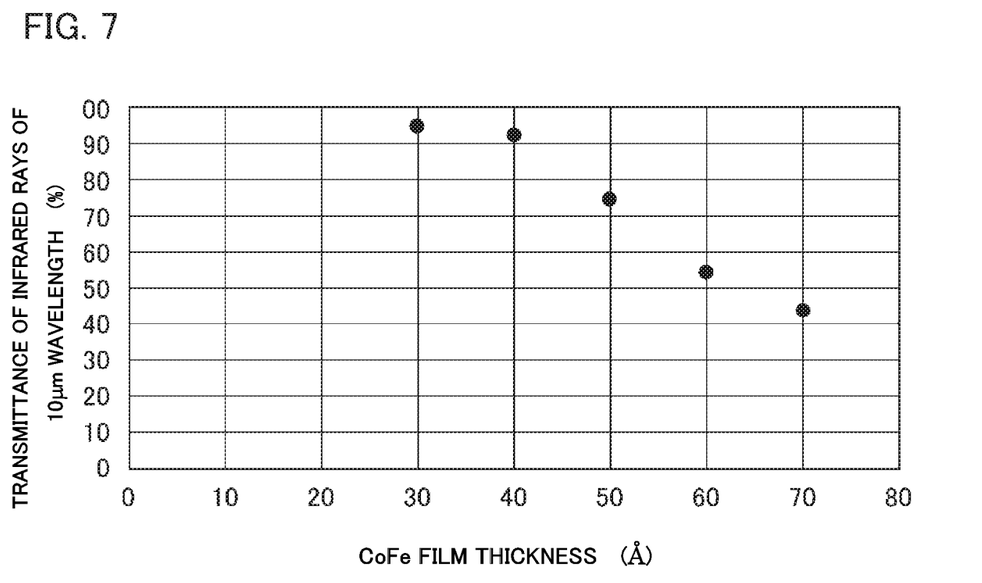
FIG. 7 is a diagram showing transmittance of infrared rays with a wavelength of 10 μm by an oxidized cobalt iron film.

FIG. 7 shows results of an experiment regarding infrared transmittance of an oxidized cobalt iron film. In FIG. 7, a vertical axis shows transmittance (%) of infrared rays of a wavelength of 10 μm, and a horizontal axis shows a thickness (Å) of the oxidized cobalt iron film. The experiment results are that the transmittance of infrared rays of a wavelength of 10 μm of the oxidized cobalt iron film is 50% or more at a film thickness of 60 Å or less, and 90% or more at a film thickness of 40 Å or less.

In the first embodiment, the thickness of the cobalt iron film that is the supporting body metal wiring 54 is 40 Å, but when a greater portion of the film thickness of 40 Å is oxidized, the transmittance of infrared rays of a wavelength of 10 μm is 90% or more, and there is hardly any infrared ray reflection. However, wiring resistance increases when the whole of the film is oxidized, and it is necessary to leave a non-oxidized portion in order that a function as wiring can be maintained.

According to the first embodiment, the supporting body metal wiring 54 disposed in the supporting body 5 allows infrared rays to pass through, because of which, even when the supporting body 5 is disposed directly above the infrared detecting portion 4 so as to cover one portion of the infrared detecting portion 4, infrared rays pass through the supporting body 5, and are absorbed by the infrared detecting portion 4. Therefore, there is no need to provide an infrared absorption layer in an upper layer of the supporting body 5, the structure is simple, and manufacture is easy. As opposed to this, an existing structure is such that metal wiring disposed inside a supporting leg acts optically as a reflecting film, because of which an infrared absorption layer needs to be provided in an upper layer of the supporting leg, and the structure is complex.

Also, in the first embodiment, the layer forming the supporting body 5 and the layer forming the infrared detecting portion 4 are formed as separate layers, and the supporting body 5 and the infrared detecting portion 4 are provided in differing planes, because of which the supporting body 5 can be formed to be long over a wider range than in an existing structure wherein a supporting body and an infrared detecting portion are formed in the same layer. Because of this, the supporting substrate 10 and the infrared detecting portion 4 can be thermally separated, and thermal conductance can be reduced. Also, a large pixel aperture ratio can be adopted, because of which incident infrared rays can be efficiently transmitted to the infrared detecting portion 4.

Also, the method of manufacturing the infrared sensor 1 according to the first embodiment is such that the infrared detecting portion 4 is formed before the supporting body metal wiring 54, because of which there is no need to take temperature tolerated by the supporting body metal wiring 54 into consideration, and a temperature sensor that needs high temperature processing in the formation process can be used. Furthermore, advantages of high temperature heat treatment, that is, advantages of increasing electrical characteristic stability by recovering plasma damage in a manufacturing device, and restricting noise occurring in an electrical contact portion, can be enjoyed.

Also, the method of manufacturing the infrared sensor 1 according to the first embodiment is such that although a process of modifying the supporting body metal wiring layer so that infrared rays can pass through is needed, a process of oxidizing or nitriding the supporting body metal wiring layer can be carried out easily in an existing device, and no complex process or new equipment investment is needed, because of which a rise in manufacturing cost can be restricted.

According to the first embodiment, as heretofore described, the infrared image sensor 105 including the small, highly sensitive, low cost infrared sensor 1 is obtained. Also, the thermal infrared solid-state imaging device 100 including the infrared image sensor 105 according to the first embodiment is small and highly sensitive, and can realize a low cost.

Second Embodiment

An infrared sensor according to a second embodiment of the invention is such that supporting body metal wiring disposed in the supporting body 5 is a layered film including first supporting body metal wiring 54*a* and second supporting body metal wiring 54*b*, and one portion of the layered film is oxidized or nitrided. As other configurations are the same as in the first embodiment, only differences from the first embodiment will be described in the following description.

Figure 8:
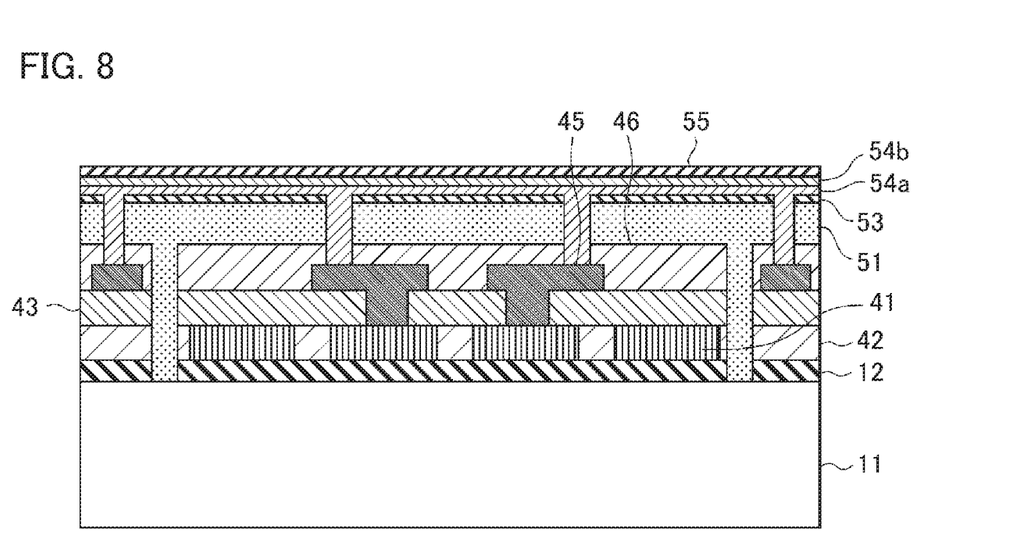
FIG. 8 is a sectional view illustrating a method of manufacturing an infrared sensor according to a second embodiment of the invention.

A method of manufacturing the infrared sensor according to the second embodiment will be described using FIG. 8. FIG. 8 shows a process that follows FIG. 6B, which is described in the first embodiment. The sacrificial layer aperture portion 52 (refer to FIG. 6B) is formed in the predetermined position, the silicon oxide film that is to form the supporting body lower layer film 53 is formed using, for example, PECVD technology so as to cover the sacrificial layer aperture portion 52 on the sacrificial layer 51 in which the metal wiring 45 connected to the PN junction diode 41 is exposed, and the silicon oxide film is removed by etching in only the sacrificial layer aperture portion 52 portion.

Continuing, a first supporting body metal wiring layer that is to form the first supporting body metal wiring 54*a* is formed using PVD technology to a film thickness of 40 Å so as to be electrically connected to the metal wiring 45 exposed in the sacrificial layer 51. Furthermore, a second supporting body metal wiring layer that is to form the second supporting body metal wiring 54*b* is formed to a film thickness of 40 Å using PVD technology. In the second embodiment, cobalt iron is used as the first supporting body metal wiring layer and the second supporting body metal wiring layer.

Continuing, the first supporting body metal wiring layer and the second supporting body metal wiring layer are oxidized by a plasma discharge being carried out in an oxygen atmosphere, thereby being modified so that infrared rays pass through. Subsequently, a silicon oxide film that is to form the supporting body upper layer film 55 is deposited using, for example, PECVD technology. In the second embodiment, the supporting body metal wiring is a layered film of two layers, but the supporting body metal wiring may also be a layered film of more than two layers.

In the second embodiment, the supporting body metal wiring is a layered film including the first supporting body metal wiring 54*a* and the second supporting body metal wiring 54*b*, each having a film thickness of 40 Å, because of which the infrared transmittance is lower than that of the single-layer supporting body metal wiring 54 having a film thickness of 40 Å in the first embodiment. By adopting a layered film, however, advantages are obtained in that coverage of the contact portion increases, contact resistance decreases, and noise decreases.

The heretofore described advantages are also obtained by increasing the film thickness of a single layer, but in this case, obtaining high infrared transmittance is difficult. According to the experiment results of FIG. 7, the transmittance of infrared rays of a wavelength of 10 μm is 90% or more for an oxidized cobalt iron film with a thickness of 40 Å, and even when two layers of the cobalt iron film are placed one on top of the other to make a layered film with a thickness of 80 Å, an infrared transmittance of 90% squared, which is 80% or more, is obtained. Meanwhile, with a single-layer oxidized cobalt iron film with a thickness of 80 Å, only an infrared transmittance of 40% or less is obtained, because of which it is desirable to adopt a layered film.

According to the second embodiment, in addition to the same advantages as in the first embodiment, the supporting body metal wiring is a layered film of two layers or more, whereby a reduction in noise is achieved, and a small, low-noise, highly sensitive, and low-cost infrared image sensor is obtained.

Third Embodiment

An infrared sensor according to a third embodiment of the invention is such that supporting body metal wiring disposed in the supporting body is a layered film including the first supporting body metal wiring 54*a* and the second supporting body metal wiring 54*b*, and one portion of the layered film is oxidized or nitrided, in the same way as in the second embodiment. In the third embodiment, the wiring resistance of the supporting body metal wiring is reduced further than in the second embodiment, because of which the thickness of the first supporting body metal wiring 54*a* is 70 Å. As other configurations and the manufacturing method are the same as in the first embodiment and the second embodiment, a description will be omitted here.

Figure 9:
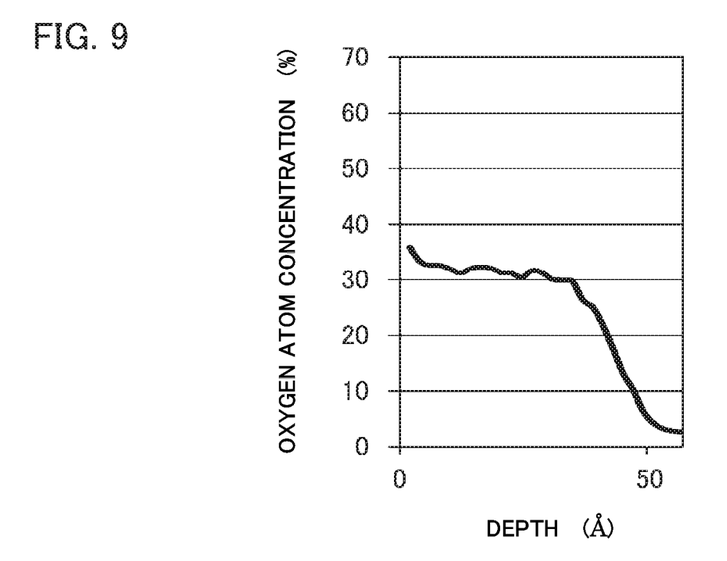
FIG. 9 is a diagram showing an oxygen atom concentration in a depth direction of an oxidized cobalt iron film that configures supporting body metal wiring of an infrared sensor according to a third embodiment of the invention.

FIG. 9 shows an oxygen atom concentration in a depth direction of an oxidized cobalt iron film that configures the supporting body metal wiring of the infrared sensor according to the third embodiment. In FIG. 9, a vertical axis is the oxygen atom concentration (%), and a horizontal axis is a depth (Å) from a surface of the supporting body metal wiring. When the whole of the cobalt iron film is oxidized, the film resistance, that is, the wiring resistance, increases, and the cobalt iron film ceases to function as wiring. Because of this, in the third embodiment, the film thickness of the first supporting body metal wiring 54*a* is large at 70 Å, causing a non-oxidized metal layer to remain in a film bottom portion.

In the third embodiment, as shown in FIG. 9, the oxidized cobalt iron film has an oxygen atom concentration that is stable at 30% or more as far as a depth of in the region of 30 Å from the surface, but when the depth from the surface reaches in the region of 50 Å, the oxygen atom concentration in the film is low at a few percent. Because of this, a resistance reasonable for wiring is obtained by the film thickness of the first supporting body metal wiring 54*a* being 70 Å, and a non-oxidized layer of in the region of 10 Å to 40 Å being left. Also, the contact resistance decreases further, and ohmic contact is realized.

According to the third embodiment, in addition to the same advantages as in the first embodiment and the second embodiment, the supporting body metal wiring is a layered film of two layers or more, and the film thickness of the first supporting body metal wiring 54*a* is greater than in the second embodiment, whereby the contact resistance can be reduced further. The embodiments can be freely combined, and each embodiment can be modified or abbreviated as appropriate, without departing from the scope of the invention.

What is claimed is:

1. A thermal infrared detector comprising, on a substrate, an infrared detecting portion having a temperature sensor that converts a temperature change caused by an incidence of infrared rays into an electrical signal, and a supporting body having a supporting body metal wiring that reads an electrical signal from the temperature sensor, wherein the infrared detecting portion is held by the supporting body via a hollow portion between the infrared detecting portion and the substrate, the supporting body is provided so as to cover one portion of the infrared detecting portion as seen from an infrared ray incident direction in a differing plane spatially separated from the infrared detecting portion, and a metal material that allows infrared rays to pass through is used for the supporting body metal wiring.

2. The thermal infrared detector according to claim 1, wherein the supporting body metal wiring is an oxidized or nitrided metal film.

3. The thermal infrared detector according to claim 2, wherein a portion of the supporting body metal wiring of a predetermined depth in a film thickness direction from a surface is oxidized or nitrided, and a portion that is not oxidized or nitrided is left.

4. The thermal infrared detector according to claim 3, wherein the supporting body metal wiring is of cobalt iron.

5. The thermal infrared detector according to claim 3, wherein the supporting body metal wiring is of titanium, aluminum, chromium, or an alloy including any one of these.

6. The thermal infrared detector according to claim 2, wherein the supporting body metal wiring is of cobalt iron.

7. The thermal infrared detector according to claim 2, wherein the supporting body metal wiring is of titanium, aluminum, chromium, or an alloy including any one of these.

8. The thermal infrared detector according to claim 2, wherein the supporting body metal wiring is a layered film of two layers or more including a first supporting body metal wiring and a second supporting body metal wiring, and one portion of the layered film is oxidized or nitrided.

9. The thermal infrared detector according to claim 1, wherein the temperature sensor is a multiple of diodes connected in series.

10. The thermal infrared detector according to claim 1, wherein the substrate is such that a single crystal silicon layer is formed across an embedded silicon oxide film layer on a single crystal silicon substrate.

11. A method of manufacturing a thermal infrared detector such that an infrared detecting portion is held by a supporting body via a hollow portion between the infrared detecting portion and the substrate, the manufacturing method comprising:
   a step of forming the infrared detecting portion having a temperature sensor that converts a temperature change caused by an incidence of infrared rays into an electrical signal on the substrate;
   a step of forming a sacrificial layer that covers the infrared detecting portion and of which one portion is in contact with the substrate;
   a step of partially removing the sacrificial layer, thereby exposing one portion of the temperature sensor;
   a step of forming a supporting body metal wiring layer on the sacrificial layer so as to be electrically connected to the temperature sensor exposed in the sacrificial layer;
   a step of modifying the supporting body metal wiring layer so that infrared rays pass through; and
   a step of removing the sacrificial layer and one portion of the substrate, thereby forming the supporting body and the hollow portion.

12. The thermal infrared detector manufacturing method according to claim 11, wherein a plasma discharge is carried out in an oxygen or a nitrogen atmosphere in the step of modifying the supporting body metal wiring layer so that infrared rays pass through, thereby oxidizing or nitriding one portion of the supporting body metal wiring layer.

13. The thermal infrared detector manufacturing method according to claim 12, wherein a portion of the supporting body metal wiring layer of a predetermined depth in a film thickness direction from a surface is oxidized or nitrided, and a portion that is not oxidized or nitrided is left, in the step of modifying the supporting body metal wiring layer so that infrared rays pass through.

14. The thermal infrared detector manufacturing method according to claim 11, wherein heat treatment is carried out in an oxygen or a nitrogen atmosphere in the step of modifying the supporting body metal wiring layer so that infrared rays pass through, thereby oxidizing or nitriding one portion of the supporting body metal wiring layer.

15. The thermal infrared detector manufacturing method according to claim 14, wherein a portion of the supporting body metal wiring layer of a predetermined depth in a film thickness direction from a surface is oxidized or nitrided, and a portion that is not oxidized or nitrided is left, in the step of modifying the supporting body metal wiring layer so that infrared rays pass through.

16. The thermal infrared detector manufacturing method according to claim 11, wherein cobalt iron is used as the supporting body metal wiring layer.

17. The thermal infrared detector manufacturing method according to claim 11, wherein titanium, aluminum, chromium, or an alloy including any one of these, is used as the supporting body metal wiring layer.

\* \* \* \* \*